US012166503B1

(12) United States Patent
Halabi et al.

(10) Patent No.: US 12,166,503 B1
(45) Date of Patent: Dec. 10, 2024

(54) SYSTEM FOR NEAREST NEIGHBOR SEARCH OF DATASET

(71) Applicant: AMAZON TECHNOLOGIES, INC., Seattle, WA (US)

(72) Inventors: Nissim Halabi, Ramat Gan (IL); Noam Touitou, Ramat Gan (IL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 267 days.

(21) Appl. No.: 17/655,121

(22) Filed: Mar. 16, 2022

(51) Int. Cl.
*H03M 13/11* (2006.01)
*H03M 13/13* (2006.01)

(52) U.S. Cl.
CPC ....... *H03M 13/1105* (2013.01); *H03M 13/13* (2013.01)

(58) Field of Classification Search
CPC .......................... H03M 13/1105; H03M 13/13
See application file for complete search history.

(56) References Cited

U.S. PATENT DOCUMENTS

| | | | | |
|---|---|---|---|---|
| 9,054,876 B1* | 6/2015 | Yagnik | .................. | G06V 10/464 |
| 2015/0213375 A1* | 7/2015 | Malewicz | ............. | G06F 16/137 |
| | | | | 707/737 |
| 2017/0031624 A1* | 2/2017 | Tuers | .................... | G06F 3/0679 |
| 2018/0268015 A1* | 9/2018 | Sugaberry | ......... | G06F 16/24575 |
| 2019/0065594 A1* | 2/2019 | Lytkin | ................. | G06F 16/9536 |
| 2020/0226137 A1* | 7/2020 | Zhao | .................. | G06F 16/24553 |
| 2022/0198562 A1* | 6/2022 | Cella | ...................... | G06Q 40/04 |
| 2023/0273940 A1* | 8/2023 | Shu | ................... | G06F 16/24556 |
| | | | | 707/600 |

FOREIGN PATENT DOCUMENTS

WO    WO-2010083882 A1 * 7/2010    ........ H03M 13/1505

OTHER PUBLICATIONS

Santiago et el., "Hardware-Accelerated Similarity Search with Multi-Index Hashing," 2019 IEEE Intl Conf on Dependable, Autonomic and Secure Computing, , Fukuoka, Japan, 2019, pp. 733-740 (Year: 2019).*

(Continued)

*Primary Examiner* — Albert Decady
*Assistant Examiner* — Enamul M Kabir
(74) *Attorney, Agent, or Firm* — Lindauer Law, PLLC

(57) ABSTRACT

Low latency search for nearest neighbors in a dataset containing a large number of entries is improved using an error correction code (ECC) for partitioning data into clusters and retrieval. During initialization and preprocessing a d-dimensional space with clusters corresponding to ECC codewords is specified. Entries in the dataset are embedded into this space and associated with respective codewords, each codeword specifying a cluster. An index associates the codewords, clusters, and entries. During a query of the dataset, a query entry is processed to determine a query embedding in the d-dimensional space. The query embedding is used as input for a list decoder of the ECC. The list decoder provides a set of nearest codewords, with those codewords representing a set of candidate clusters that may contain nearest neighbors. The dataset entries associated with the candidate clusters may then be searched to determine query results comprising specific entries.

20 Claims, 6 Drawing Sheets

(56) References Cited

OTHER PUBLICATIONS

Cakir et al., "Online supervised hashing," 2015 IEEE International Conference on Image Processing (ICIP), Quebec City, QC, Canada, 2015, pp. 2606-2610 (Year: 2015).*

Norouzi et al., "Fast search in Hamming space with multi-index hashing," 2012 IEEE Conference on Computer Vision and Pattern Recognition, Providence, RI, USA, 2012, pp. 3108-3115 (Year: 2012).*

Ailon, et al., "The Fast Johnson-Lindenstrauss Transform and Approximate Nearest Neighbors", Siam J. Comput., vol. 39, No. 1, pp. 302-322, Society for Industrial and Applied Mathematics, 2009. Retrieved from the Internet: URL: https://www.cs.princeton.edu/~chazelle/pubs/FJLT-sicomp09.pdf.

Andoni, et al., "Practical and Optimal LSH for Angular Distance", NIPS, 2015, pp. 1-9. Retrieved from the Internet: URL: https://proceedings.neurips.cc/paper/2015/file/2823f4797102ce1a1aec05359cc16dd9-Paper.pdf.

Arikan, et al., "Channel polarization: A method for constructing capacity-achieving codes for symmetric binary-input memoryless channels", arXiv:0807.3917v5, Jul. 20, 2009, pp. 1-23. Retrieved from the Internet: URL: https://arxiv.org/pdf/0807.3917.pdf.

Aumuller, et al., "ANN-Benchmarks: A Benchmarking Tool for Approximate Nearest Neighbor Algorithms", arXiv:1807.05614v2 Jul. 17, 2018, 20 pages. Retrieved from the Internet: URL: https://arxiv.org/pdf/1807.05614.pdf.

Babenko, et al., "Efficient Indexing of Billion-Scale datasets of deep descriptors", Computer Vision Foundation, Open Access, pp. 2055-2063. Retrieved from the Internet: URL: https://openaccess.thecvf.com/content_cvpr_2016/papers/Babenko_Efficient_Indexing_of_CVPR_2016_paper.pdf.

"Benchmarks for Billion-Scale Similarity Search", Yandex Research, 2 pages. Retrieved from the Internet: URL: https://research.yandex.com/datasets/biganns.

Berlekamp, et al., "On the Inherent Intractability of Certain Coding Problems", IEEE 1978, pp. 384-386. Retrieved from the Internet: URL: https://resolver.caltech.edu/CaltechAUTHORS:BERieeetit78.

"Billion-Scale ANNS Benchmarks", 7 pages. Retrieved from the Internet: URL: https://big-ann-benchmarks.com/.

Cakir, et al., "Online supervised hashing", Computer Vision and Image Understanding, vol. 156, 2017, 6 pages. Retrieved from the Internet: URL: https://open.bu.edu/bitstream/handle/2144/26691/de4f14630d8606e37096235da8933df228f1.pdf?sequence=3&isAllowed=y.

Carraher, Lee, A., "A Parallel Algorithm for Query Adaptive, Locality Sensitive Hash Search", University of Cincinnati, Apr. 20, 2012, 104 pages. Retrieved from the Internet: URL: https://www.proquest.com/openview/342e8e7c5213d04a71a2885edf294e29/1?pq-origsite=gscholar&cbl=18750.

Charikar, Moses S., "Similarity Estimation Techniques from Rounding Algorithms", STOC '02, May 19-21, 2002, Montreal, Quebec, Canada, ACM 2002, pp. 9 pages. Retrieved from the Internet: URL: https://www.cs.princeton.edu/courses/archive/spr04/cos598B/bib/CharikarEstim.pdf.

Chen, et al., "SPANN: Highly-efficient Billion-scale Approximate Nearest Neighbor Search", 35th Conference on Neural Information ProcessingSystems (NeurIPS 2021), pp. 1-14. Retrieved from the Internet: URL: https://proceedings.nips.cc/paper/2021/file/299dc35e747eb77177d9cea10a802da2-Paper.pdf.

Dasgupta, et al., "A neural algorithm for a fundamental computing problem", 19 pages. Retrieved from the Internet: URL: https://www.biorxiv.org/content/10.1101/180471v1.full.pdf.

Dasgupta, et al., "Fast Locality-Sensitive Hashing", KDD '11, Aug. 21-24, 2011, San Diego, CA., ACM 2011, pp. 1073-1081. Retrieved from the Internet: URL: https://users.math.msu.edu/users/iwenmark/Teaching/MTH995/Papers/LSH_Hadamard.pdf.

"Datasets for approximate nearest neighbor search", Evaluation of Approximate nearest neighbors: large datasets, Texmex, 3 pages. Retrieved from the Internet: URL: http://corpus-texmex.irisa.fr/.

Fu, et al., "Fast Approximate Nearest Neighbor Search With The Navigating Spreading-out Graph", Proceedings of the VLDB Endowment, vol. 12, VLDB Endowment 2018, pp. 1-21. Retrieved from the Internet: URL: https://arxiv.org/pdf/1707.00143v9.pdf.

Hashemi, et al., "Simplified Successive-Cancellation List Decoding of Polar Codes", Conference Paper Jul. 2016, 6 pages. Retrieved from the Internet: URL: https://www.researchgate.net/publication/299594382_Simplified_Successive-Cancellation_List_Decoding_of_Polar_Codes.

Indyk, et al., "Approximate Nearest Neighbors: Towards Removing the Curse of Dimensionality", STOC 1998, pp. 604-613. Retrieved from the Internet: URL: https://users.math.msu.edu/users/iwenmark/Teaching/CMSE890/LSH_THM_4_609.pdf.

Jafari, et al., "A Survey on Locality Sensitive Hashing Algorithms and their Applications". arXIV:2102.08942v1, 2021, pp. 1-23. Retrieved from the Internet: URL: https://arxiv.org/pdf/2102.08942.pdf.

Johnson, et al., "Billion-scale similarity search with GPUs", Feb. 28, 2017, pp. 1-12. Retrieved from the Internet: URL: https://arxiv.org/pdf/1702.08734.pdf.

Li, et al., "Approximate Nearest Neighbor Search on High Dimensional Data—Experiments, Analyses, and Improvement", arXiv:1610.02455v1, pp. 1-26. Retrieved from the Internet: URL: https://arxiv.org/pdf/1610.02455.pdf.

Lv, et al., "Multi-probe LSH: Efficient Indexing for High-Dimensional Similarity Search", VLDB '07, Sep. 23-27, 2007, Vienna, Austria, 12 pages. Retrieved from the Internet: URL: https://www.cs.princeton.edu/cass/papers/mplsh_vldb07.pdf.

Malkov, et al., "Approximate nearest neighbor algorithm based on navigable small world graphs", Information Systems, 45 (2014) pp. 61-68. Retrieved from the Internet: URL: https://www.hse.ru/data/2015/03/13/1325528089/Approximate%20nearest%20neighbor%20algorithm%20b..navigable%20(Information%20Systems).pdf.

Malkov, et al., "Efficient and Robust Approximate Nearest Neighbor Search Using Hierarchical Navigable Small World Graphs", 22 pages. Retrieved from the Internet: URL: https://www.researchgate.net/publication/301837503_Efficient_and_Robust_Approximate_Nearest_Neighbor_Search_Using_Hierarchical_Navigable_Small_World_Graphs.

Malkov, et al., "Scalable Distributed Algorithm for Approximate Nearest Neighbor Search Problem in High Dimensional General Metric Spaces", SISAP 2012, LNCS 7404, pp. 132-147, 2012. Retrieved from the Internet: URL: https://www.researchgate.net/publication/262334462_Scalable_Distributed_Algorithm_for_Approximate_Nearest_Neighbor_Search_Problem_in_High_Dimensional_General_Metric_Spaces/link/5412d49b0cf2bb7347db0da8/download.

Ryali, et al., "Bio-Inspired Hashing for Unsupervised Similarity Search", Proceedings of the 37th International Conference on Machine Learning, Online, PMLR 119, 2020, 12 pages. Retrieved from the Internet: URL: http://proceedings.mlr.press/v119/ryali20a/ryali20a.pdf.

Saber, et al., "An Incremental Redundancy Hybrid ARQ Scheme via Puncturing and Extending of Polar Codes", 2015 IEEE, 10 pages. Retrieved from the Internet: URL: https://tarjomefa.com/wp-content/uploads/2017/10/32-English-TarjomeFa.pdf.

Sharma, et al., "Improving Similarity Search with High-dimensional Locality-sensitive Hashing", arXiv:1812.01844v1, Dec. 2018, pp. 1-12. Retrieved from the Internet: URL: https://arxiv.org/pdf/1812.01844v1.pdf.

Sivic, et al., "Video Google: A Text Retrieval Approach to Object Matching in Videos", Proceedings of the Ninth IEEE International Conference on Computer Vision(ICCV 2003), IEEE Computer Society, 8 pages. Retrieved from the Internet: URL: https://www.robots.ox.ac.uk/~vgg/publications/papers/sivic03.pdf.

Subramanya, et al., "DiskANN: Fast Accurate Billion-point Nearest Neighbor Search on a Single Node", 33rd Conference on Neural Information ProcessingSystems (NeurIPS 2019), pp. 1-11. Retrieved from the Internet: URL: https://proceedings.neurips.cc/paper/2019/file/09853c7fb1d3f8ee67a61b6bf4a7f8e6-Paper.pdf.

Tal, et al., "List Decoding of Polar Codes", arXiv:1206.0050v1, May 31, 2012, pp. 1-11. Retrieved from the Internet: URL: https://arxiv.org/pdf/1206.0050.pdf.

(56) References Cited

OTHER PUBLICATIONS

Wang, et al., "A Survey on Learning to Hash", Journal of Latex Class Files, vol. 13, No. 9, Sep. 2014, pp. 1-22. Retrieved from the Internet: URL: https://www.microsoft.com/en-us/research/wp-content/uploads/2017/01/LTHSurvey.pdf.

Wang, et al., "Hashing for Similarity Search: A Survey", Aug. 13, 2014, pp. 1-29. Retrieved from the Internet: URL: https://www.microsoft.com/en-us/research/wp-content/uploads/2017/02/HashingSurvey-August-13-2014.pdf.

* cited by examiner

SYSTEM FOR NEAREST NEIGHBOR SEARCH OF DATASET

BACKGROUND

Datasets containing billions of entries are now in use. Some applications involve processing a query to find one or more entries that are "nearest neighbors" in the dataset.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features. The figures are not necessarily drawn to scale, and in some figures, the proportions or other aspects may be exaggerated to facilitate comprehension of particular aspects.

Figure 1:
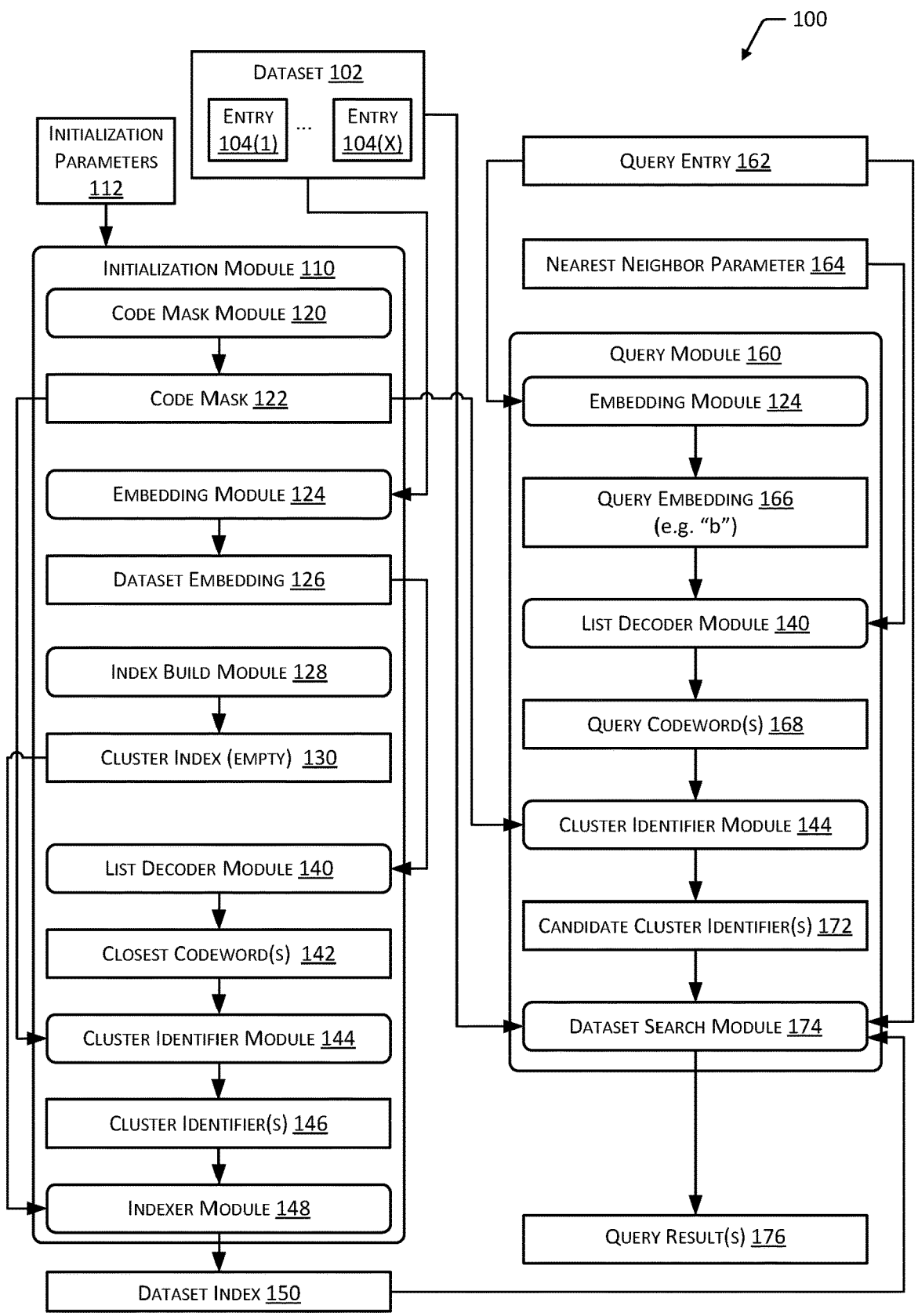
FIG. 1 illustrates a system to cluster and index entries in a dataset and search a dataset using error correction codes, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Many systems in use utilize datasets containing very large numbers of entries. For example, a dataset may contain billions of entries, each providing information about a particular item for purchase. The size of these datasets continues to grow, resulting in increasing demands for computational resources to find particular entries in those datasets. For example, while memory to store the entries of the dataset itself continues to grow, the memory required to store indices or other information used to find entries in those datasets has also grown. The proverbial problem of finding a needle in a haystack is much simpler than trying to quickly and efficiently find a particular entry in a dataset containing billions of records.

The problem becomes more complex when trying to find a "nearest neighbor". In some implementations, a "nearest neighbor" is an entry that, based on one or more parameters, has some similarity to a query entry. For example, a query for "green shirt" that returns "nearest neighbors" may return results such as "green tunic", "green jersey", "forest camouflage sweater", and so forth. These are not exact matches to the query, but have the similarity of "greenness" in this example.

Traditional techniques do not scale well to these very large, and increasing, sizes of datasets. For example, locality-sensitive hashing (LSH) involves construction and maintenance of many different indices or tables that specify clusters. Entries in the dataset may be associated with a cluster. During setup this requires substantial computational resources and memory to build and store these indices. During query, multiple indices may be consulted, increasing use of computational resources.

Another drawback to LSH and related techniques is relatively poor recall. Recall is the fraction of results to a query that are within a specified range in a space of the dataset. For example, a high recall means many results that are "close" to one another are returned, while a low recall means few results that are "close" are returned. The recall of a particular query may be improved at the expense of performing additional computations and searches. These additional computations increase the computational resources used to respond to a query, may increase latency, and so forth.

Described in this disclosure is a system and techniques for performing a highly efficient nearest neighbor search of a dataset. The system allows for substantial reduction in the memory requirements, such as fewer and smaller indices, while providing substantial improvements in recall. The system is readily scalable to large datasets and different dimensionality of those datasets. The system uses error correction codes and associated list decoders to specify codewords and arrange information about entries into clusters that are associated with those codewords. During a query, the list decoder is used to determine a set of codewords, each codeword denoting a cluster to search. By using the list decoder for an error correction code such as a polar code, the set of codewords inherently indicates those clusters containing entries that are "nearest" to the query. The system is able to operate with a minimum number of indices, reducing memory consumption, while providing high recall.

Illustrative System

FIG. 1 illustrates a system 100 to perform nearest neighbor searches of a data set 102 using error correction codes, according to some implementations. The dataset 102 may comprise a plurality of entries 104(1), 104(2), . . . 104(X). In some circumstances, the dataset 102 may comprise billions of entries 104. Each entry 104 may comprise information representative of one or more attributes of an item, digital content, or other information. The entries 104 may be complex, real, binary, or other data types. In some implementations, the entry 104 may comprise a plurality of vector values, each vector value representing information within a respective vector space. For example, an entry 104 in a dataset 102 about items for sale may have various dimensions such as item price, item category, item size, item ship weight, item color, item manufacturer, and so forth. Continuing the example, the entry 104 may comprise 256 different dimensions, each dimension representing a different characteristic. In some implementations, the plurality of vector values may be determined by processing one or more input vectors using a function or system, such as a trained neural network.

Searches may be performed to find one or more entries 104 in the dataset 102. In some situations, a search may be limited to finding a single entry 104. This search for an exact match to the specific values of one or more dimensions may be of limited use, especially in datasets 102 having billions of records. For example, the set of results may be too large to be useful.

In comparison, it is often useful to find a set of "nearest neighbors" that are entries 104 having some degree of similarity with respect to one or more of their respective dimensions. The allowance for variance from the exact match allows a substantial improvement in the search results provided. For example, by returning similar entries 102, a suitable alternative, substitute, or better choice may become available to a user that would not have otherwise been presented.

The system 100 includes an initialization module 110 and a query module 160. Both utilize at least a portion of one or more error correcting codes (ECCs) during operation. Traditionally ECCs are used to correct for loss or corruption of information. For example, an ECC may be used to mitigate dropouts or noise on a channel. As described in the following, an ECC may instead be used to facilitate partitioning an embedding space into clusters, associating particular entries 104 with respective clusters, and allowing a computationally efficient process to determine those clusters that are nearest to a query value. In one implementation the ECC utilized may be a polar code algorithm.

The concept of polar codes for use in communications has been attributed to Erdal Arikan. See Arikan, E, "Channel polarization: A method for constructing capacity-achieving codes for symmetric binary-input memoryless channels", IEEE Transactions on Information Theory, 55(7): 3051-3073, 2009. A polar code has several useful attributes, including the ability to linearly map a K-bit value into an N-bit codeword, where K is <<N. The techniques described in this disclosure may utilize polar codes or other ECC algorithms having suitable attributes.

The initialization module 110 accepts as input the dataset 102 or at least a portion thereof and one or more initialization parameters 112.

The initialization parameters 112 may specify one or more of NBIT indicating a dimensionality of a cluster identifier, CDIM indicating the desired bit length of a codeword, or NPROBE indicating a number of codewords (and corresponding clusters) to return for further search.

The initialization module 110 may include a code mask module 120 that determines a code mask 122. The determination of the code mask 122 may be based on one or more of the initialization parameters 112. In one implementation, the code mask module 120 may implement the "genie-aided generation" technique described by Arikan. As there is no communication channel, the process may use noise from a binary symmetric channel (BSC) comprising random bit flips. Once the code mask 122 has been generated it may be stored for later use. The code mask 122 is independent of the values of the entries 104 of the dataset 102.

The initialization module 110 may include an embedding module 124. The embedding module 124 is used to determine dataset embeddings 126 "b" for the entries 104 "p" of the dataset 102 "D". The dataset embedding 126 may be a binary embedding or non-binary embeddings. In one implementation, the embedding module 124 may implement a hyperplane locality-sensitive hash (LSH) algorithm to determine the dataset embedding 126. In other implementations other techniques or algorithms may be used. For example, the embedding module 124 may utilize a trained machine learning system. The dataset embedding 126 may have a greater dimensionality than the particular entry 104 it is associated with. For example, the dataset embedding 126 may have 512 dimensions while the entry 104 has 256 dimensions.

The initialization module 110 may include an index build module 128. The index build module 128 may determine an empty cluster index 130 "M" for each codeword, given the initialization parameters 112. For example, the cluster index 130 may specify all available codewords and their corresponding cluster identifiers, as described below. For example, the cluster identifier may be determined based on the codeword and the code mask 122. This is described in more detail with regard to FIG. 4.

The initialization module 110 may include a list decoder module 140. The list decoder module 140 implements a list decoder algorithm that maps an input to one or more codewords. This is a useful attribute in a "nearest neighbor" search because the codewords returned are "nearest" one another. Each codeword corresponds to a respective cluster or volume in the embedding space. The "nearest" codewords thus correspond to their respective clusters, that are "nearest" in the embedding space and in the vector space of the dataset 102. In one implementation, the list decoder module 140 may implement the polar code list decoder algorithm described by Hashemi. See Hashemi, S. A., Condo, C., and Gross, W. J., "Simplified successive-cancellation list decoding of polar codes", 2016 IEEE International Symposium on Information Theory (ISIT), pp. 815-819. IEEE, 2016.

During initialization, the dataset embedding 126 is processed by the list decoder module 140 to determine one or more closest codewords 142 "c". In one implementation, a single closest codeword 142 may be provided by the list decoder 140 for each dataset embedding 126 that is provided as input. In other implementations, a plurality of closest codewords 142 may be provided by the list decoder 140.

A cluster identifier module 144 may be used to determine a cluster identifier 146 "a" of a codeword that is provided as input. In this illustration, the initialization module 110 includes a cluster identifier module 144 that accepts as input the closest codeword(s) 142 and provides as output a cluster identifier 146. The cluster identifier module 144 may use the code mask 122 and the closest codeword 142 to determine the cluster identifier(s) 146. The determination of the cluster identifiers 146 is illustrated with respect to FIG. 4. The cluster identifier 146 provides a value that is unique to each codeword, and thus to each cluster in the embedding space that is associated with that codeword.

The initialization module 110 may include an indexer module 148 to determine a dataset index 150. The indexer module 148 may use as input the empty cluster index 130 "M" and the cluster identifiers 146 "a" that correspond to the closest codeword(s) 142 "c". The dataset index 150 may comprise data that is indicative of an association between the entry 104 "p" and one or more of the closest codeword(s) 142 "c" or the cluster identifier(s) 146 "a".

The use of the cluster identifiers 146 by the system 100 reduces the size of the data stored in the dataset index 150. This reduces the amount of memory consumed for persistent storage, and also reduces the amount of data that is processed during use of the dataset index 150. In another implementation, the cluster identifiers 146 may be omitted with the dataset index 150 storing the closest codeword(s) 142 and data indicative of their respective entry 104 in the dataset 102.

Operation of the initialization module 110 may be further described with respect to Algorithms 1 and 2.

Initialization:
  Generate a polar code mask $r \in \{0,1\}^{CDIM}$ that has exactly NBIT 1-valued entries.
  Generate an LSH-based binary embedding $\beta: \mathbb{R}^d \rightarrow \{0,1\}^{CDIM}$.
  Initialize the cluster index $\mathcal{M} = (\mathcal{M}_a)_{a \in \{0,1\}^{NBIT}}$ to contain empty sets.
  Preprocessing($\mathcal{D}$):
  for $p \in \mathcal{D}$ do
    Let $b \leftarrow \beta(p)$
    {Determine the closest codeword to b.}
    Let $c=(c_0, \ldots, c_{CDIM-1}) \leftarrow \text{ListDecoding}(b, 1)$.
    {determine the NBIT-bit cluster identifier for c.}
    Let $a \leftarrow (c_i)_{i|r_i=1}$.
    {Add the dataset entry to the cluster.}
    Add p to $\mathcal{M}_a$
  end for Algorithm 1—Initialization and Preprocessing The indexer module 148 may be configured to produce a single dataset index 150 or a plurality of dataset indices 150. In one implementation, the embedding, such as the dataset embedding 126 or the query embedding 166, may be shifted before processing by the subsequent embedding module 124. The shift may be one or more of random or based on a predetermined value. The shift may comprise application of one or more "exclusive or" (XOR) masks to a binary embedding, values to a non-binary embedding, and so forth. For example, an XOR function may be used to determine the query embedding 166 by processing an output from the embedding module 124 with an XOR mask. In another example, a value may be predetermined or determined randomly and used as an input to an operation that also accepts as an input the output from the embedding module 124 to determine a non-binary query embedding 166. The value may be real, complex, or other types of data. For example, the operation may comprise addition, subtraction, multiplication, division, or other operations involving a real value to modify a non-binary query embedding 166 that includes a vector value by multiplying the vector value by a scalar value to determine the query embedding 166.

In another implementation, the shift may comprise determining a random permutation of the coordinates of the binary embedding. The shift to the inputs is equivalent to randomly shifting the codewords produced by the list decoder module 140. In one implementation, the indexer module 148 may determine dataset indices 150 for different random shifts, providing additional perspectives when querying the dataset 102.

In one implementation, the list decoder module 140 may implement the following algorithm. The list-decoding algorithm may comprise that specified by Hashemi et al.

ListDecoding($b, \ell$):
  {This algorithm returns the $\ell$ closest codewords in C to $b \in \{0,1\}^{CDIM}$ (with high probability).}
  Define $\ell' \leftarrow f(\ell) \geq \ell$.
  Use the list—decoding algorithm on b with list size $\ell'$ to obtain a set S of codewords, where $|S| = \ell'$.
  Return the $\ell$ nearest codewords to b in S.

Algorithm 2—List Decoding Wrapper

The function $f$ of Algorithm 2 provides a mapping between values. For example, $f$ may comprise an identity mapping of $f(x)=x$. In another implementation, the mapping may be determined empirically. For example, $f(\ell)$ may be:
  16  $\ell=1$
  32  $1 < \ell \leq 16$
  $2\ell$  $16 < \ell \leq 256$
  $\ell$  $\ell > 256$ Expression 1

The system 100 may now use the dataset index 150 to perform a nearest neighbor search, as described next. Depending on the performance sought, increasing the number of closest codewords 142 may increase the size of the dataset index 150, while reducing latency at query. For example, the list decoder module 140 may return four closest codewords 142 per dataset embedding 126 and the dataset index 150 may associate the corresponding four cluster identifiers 146 with the entry 104.

The system 100 may include a query module 160. The query module 160 accepts as input a query entry 162 "q". For example, the query entry 162 may comprise a vector value with the same dimensionality as the dataset 102.

The query module 160 may include, or utilize, the embedding module 124. The embedding module 124 accepts as input the query entry 162 and determines a query embedding 166 "b". The query embedding 166 may comprise a binary embedding or a non-binary embedding.

The query module 160 may include, or utilize, the list decoder module 140. The list decoder module 140 accepts as input the query embedding 166 and determines a set of one or more query codewords 168. The quantity of codewords returned may be specified by a nearest neighbor parameter 164, such as NPROBE. For example, the nearest neighbor parameters 164 may specify to return the four closest codewords 142. The list decoder module 140 may deduplicate the resulting query codeword(s) 168, producing a set of query codeword(s) that are not duplicative.

The query module 160 may include, or utilize, the cluster identifier module 144. The cluster identifier module 144 accepts as input the query codeword(s) 168 and determines a set of one or more candidate cluster identifiers 172. As described above, in some implementations the cluster identifiers may be omitted and codewords used to specify clusters. The cluster identifier module 144 may deduplicate the resulting candidate cluster identifiers 172, producing a set of candidate cluster identifiers 172 without duplicate cluster identifiers.

The query module 160 may include, or utilize, a dataset search module 174. The dataset search module 174 accepts as input one or more of the query entry 162, the candidate cluster identifiers 172, or the dataset index 150. The dataset search module 174 may use the candidate cluster identifiers 172 to determine entries 104 in the dataset 102 that are potential nearest neighbors to the query entry 162. In some implementations, before performing the search, the dataset search module 174 may deduplicate the set of entries 104 that are potential nearest neighbors.

In one implementation, the dataset search module 174 may perform an exhaustive search on the portions of the dataset 102 that correspond to the specified clusters. In other implementations, other search techniques may be used.

The dataset search module 174 may determine additional information about those entries 104 that correspond with those candidate cluster identifiers 172. For example, the query module 160 may determine a distance, in the vector space of the dataset 102, between the query entry 162 and the one or more entries 104 corresponding to the candidate cluster identifiers 172. The entries 104 that are less than a threshold distance in the vector space may be deemed to be "nearest neighbors" and provided as query results 176. In some implementations, the query results 176 may be sorted, such as by distance from the query entry 162.

In another example, the query module 160 may determine a distance, in the vector space of the embedding space, between the query embedding 166 and the one or more dataset embeddings 126 of entries 104 corresponding to the candidate cluster identifiers 172.

Operation of the query module 160 may be further described with respect to Algorithm 2 as described above and Algorithm 3.

UponQuery(q, SIZENN):
    {get the closest NPROBE codewords to b.}
    Let b & B(q)
    Let $c^0, \ldots, c^{NPROBE-1}$←ListDecoding(b, NPROBE).
    Let H be an empty list of (distance, point) pairs.
    for $i \in \{0, \ldots, NPROBE-1\}$ do
        Denote $c^i = (c_0^i, \ldots, c_{CDIM-1}^i)$.
        {Extract the NBIT—bit cluster identifier for $c^i$}
        Let $a \leftarrow (c_j^i)_{j|r_j=1}$.
        for $p \in \mathcal{M}_a$ do
            Set $\delta_p \leftarrow d(q, p)$.
            Add $(\delta_p, p)$ to H.
        End for
    end for
    Choose and return the SIZENN entries in H with the smallest distance.

Algorithm 3—Upon Query

In the algorithms described above, the ECC may utilize a binary code and the embedding module 124 provides a binary embedding in a binary space. In other implementations a non-binary ECC may be used. The embedding module 124 may determine dataset embeddings 126 in a non-binary code space. The dataset embeddings 126 and query embeddings 166 will be of the same dimension of the non-binary code space. For example, the non-binary ECCs may include but are not limited to a Reed-Solomon ECC, non-binary polar codes, lattice codes, and so forth with corresponding decoders or list decoders.

Figure 2:
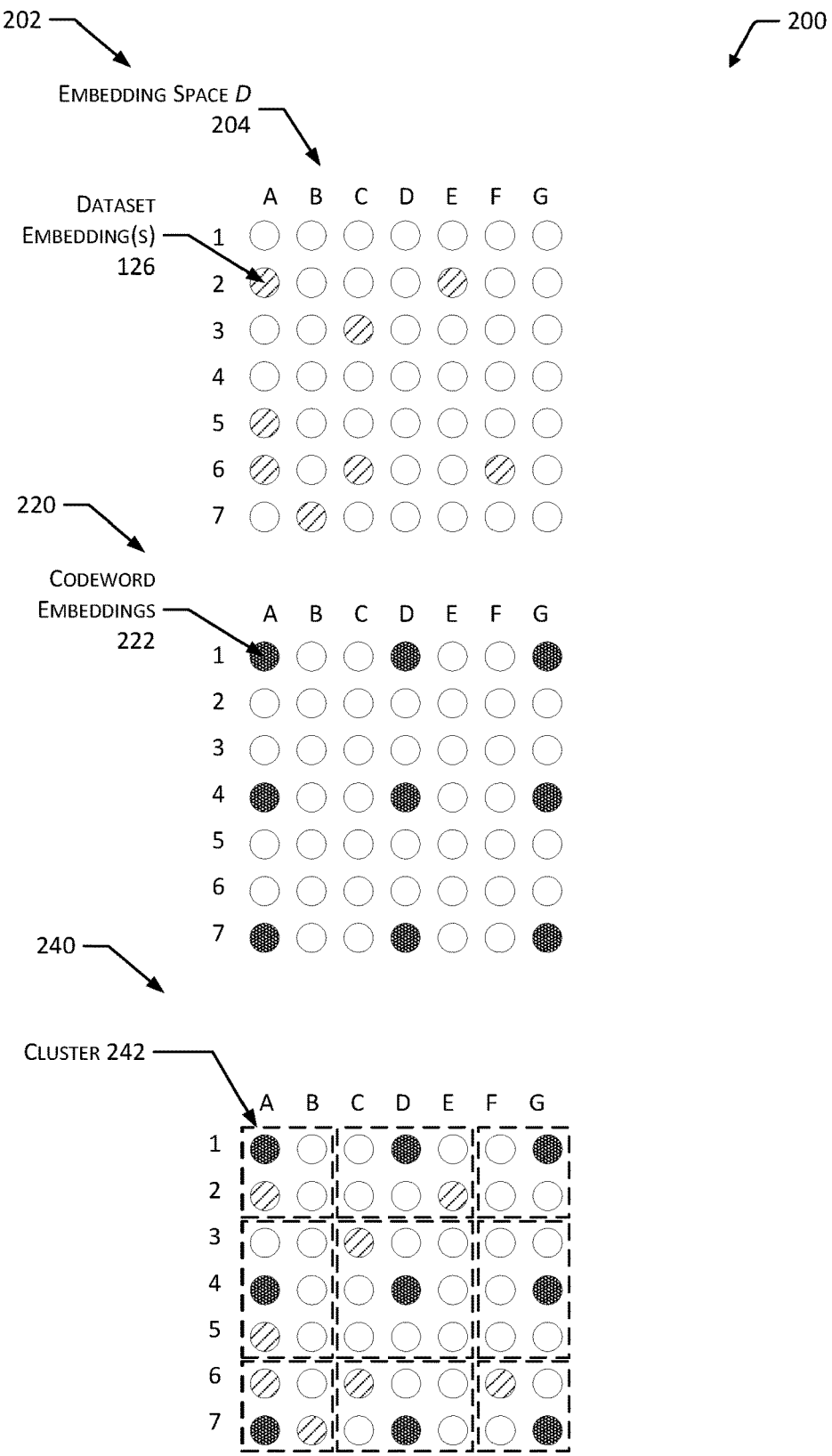
FIG. 2 illustrates initialization of the system, according to some implementations.

FIG. 2 illustrates at 200 initialization of the system 100, according to some implementations. With regard to FIG. 2 and FIG. 3, an embedding space of dataset "D" 204 with two dimensions is shown for ease of illustration and not by way of limitation. For ease of discussion, also shown are row and column indices that may be used to specify a particular point in the embedding space 204.

At 202, dataset embeddings 126 within the embedding space D 204 are determined for each of the entries 104 in the dataset 102. For example, the embedding module 124 may use a hyperplane locality-sensitive hash (LSH) to determine the dataset embedding 126.

At 220, codeword embeddings 222 are depicted and the dataset embeddings 126 have been omitted. For example, the codeword embeddings 222 may be representative of an embedding in the embedding space 204 of a value in the dataset 102 vector space that corresponds to the closest codeword(s) 142.

At the 240, the dataset embeddings 126 and codeword embeddings 222 are depicted, as well as boundaries of clusters 242. A cluster 242 may be deemed a volume within the embedding space 204. In the implementation shown here, each cluster 242 is associated with a single codeword embedding 222. For example, there is a one-to-one mapping of codeword to cluster. Each cluster 242 may be specified by a cluster identifier, such as the cluster identifier 146 or 172. In other implementations, a cluster 242 may encompass two or more codeword embeddings 222. In yet another implementation clusters 242 may overlap, such that a single dataset embedding 126 is associated with two or more clusters 242.

Figure 3:
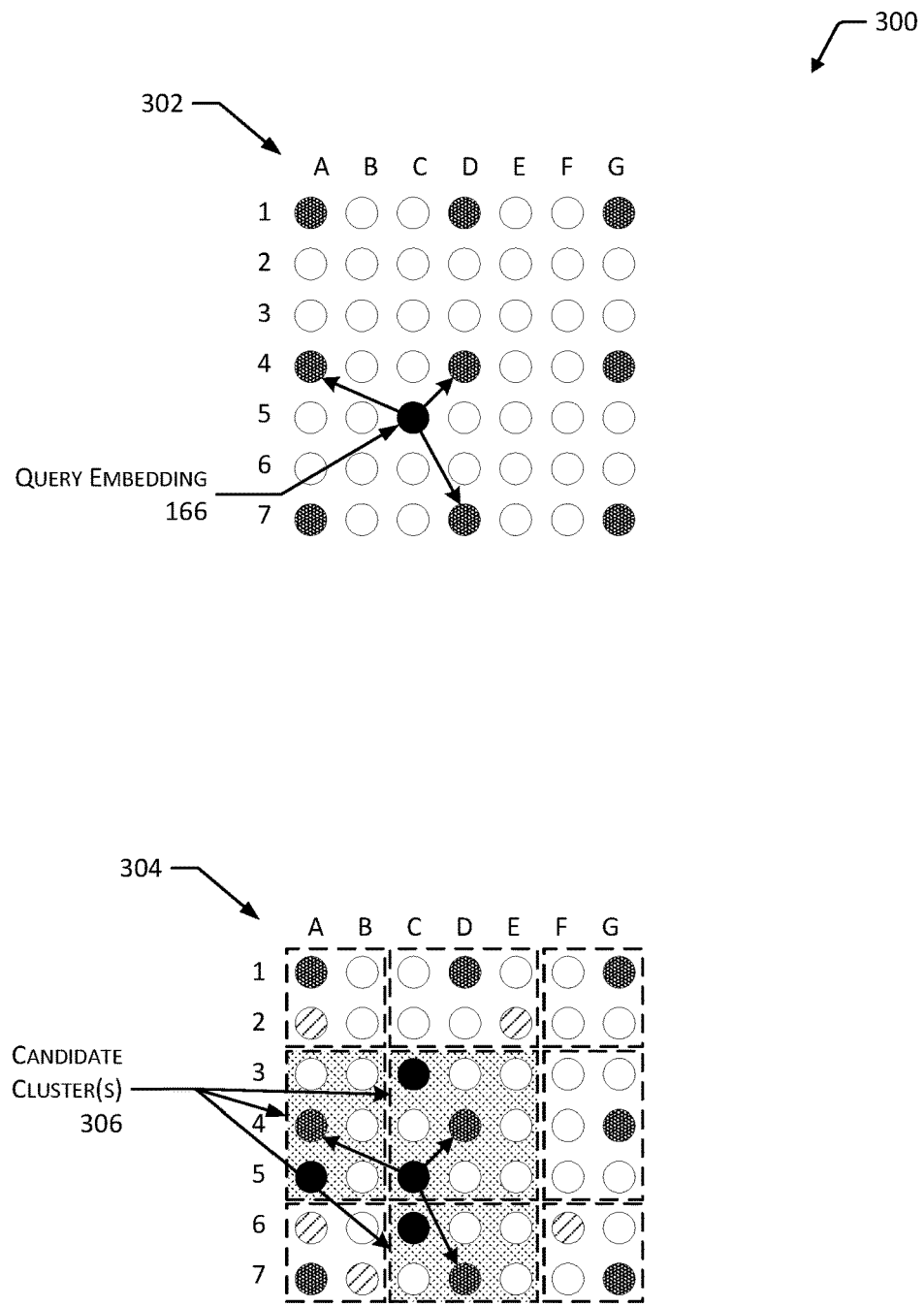
FIG. 3 illustrates a query using the system, according to some implementations.

FIG. 3 illustrates at 300 a query using the system 100, according to some implementations. At 302, a query embedding 166 has been determined. As shown, the query embedding 166 is located at location C5 in the embedding space 204.

At 304, boundaries of the clusters 242 are determined. A set of candidate clusters 306 are shown. As described above, the set of candidate clusters 306 may be determined by processing the query embedding 166 with the list decoder module 140 to determine query codewords 168. The query codewords 168 may then be processed to determine the candidate cluster identifiers 172 that indicate the candidate clusters 306 shown.

Figure 4:
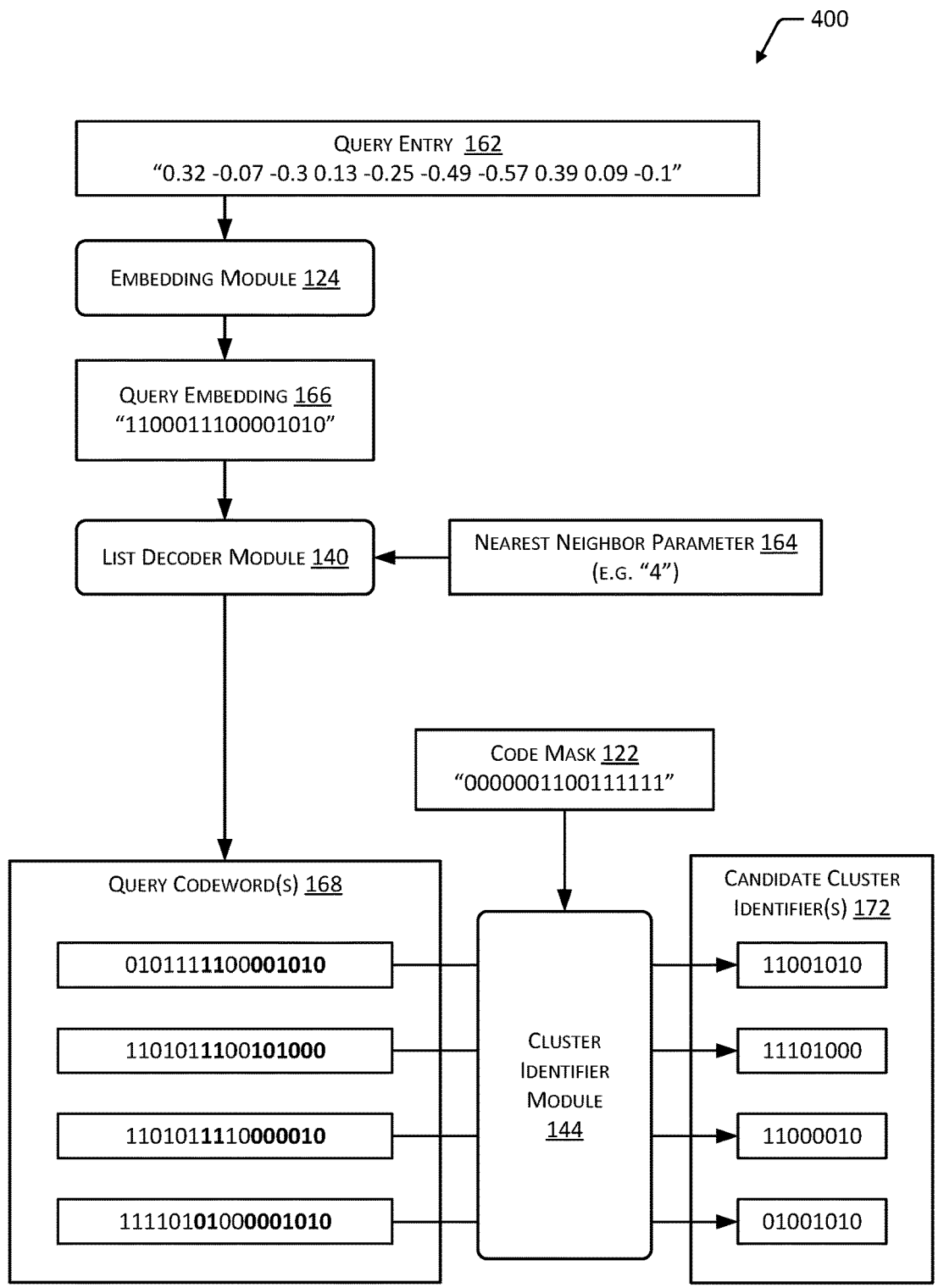
FIG. 4 is a block diagram of determining search candidate clusters during a query, according to some implementations.

FIG. 4 is a block diagram 400 of determining candidate cluster identifiers 172 during a query, according to some implementations. In this diagram, a query entry 162 comprising a vector value in the same vector space of the dataset 102 is processed by the embedding module 124. The query entry 162 has a first dimensionality. For example, the vector space of the dataset 102 may use 256 dimensions. The embedding module 124 determines the query embedding 166 based on the query entry 162. The query embedding 166 has a second dimensionality. The second dimensionality may be greater than the first dimensionality. For example, the embedding space of the query embedding 166 may use 512 dimensions. The list decoder module 140 accepts the query embedding 166 as input and determines a set of query codewords 168. The size of the set may be specified by the nearest neighbor parameter 164. For example, the nearest neighbor parameter 164 in this illustration is "4", indicating that the set of query codewords 168 will consist of at most four codewords.

The set of query codewords 168 and the code mask 122 are used by the cluster identifier module 144 to determine the candidate cluster identifiers 172. The cluster identifiers indicative of a specific cluster may have a third dimensionality. The third dimensionality may be less than the first dimensionality or the second dimensionality.

In one implementation in which polar codes are used as the error correction code, the cluster identifier may be determined by removing digits that are associated with a mask value of "0" and retaining those with a mask value "1". This is illustrated in FIG. 4 and shown in Table 1.

TABLE 1

| Code mask | 0000001100111111 |
|---|---|
| Codeword | 0101111100001010 |
| Cluster Identifier | 11001010 |

In some implementations, the size of the dataset index 150 may be reduced by omitting the codewords and storing only the cluster identifier. This reduces the amount of memory, both persistent and non-persistent, that is required during storage of the dataset index 150 and subsequent processing.

As described above, the candidate cluster identifiers 172 may then be used by the dataset search module 174 to determine which portions of the dataset 102 to search.

In another implementation (not depicted) the query codewords 168 may be processed by a decoder associated with the ECC in use to determine an information word. In some implementations, the information word may be used instead of, in place of, or as the candidate cluster identifiers 172. In some implementations the information word may be stored in the dataset index 150 and associated with one or more entries 104.

Figure 5:
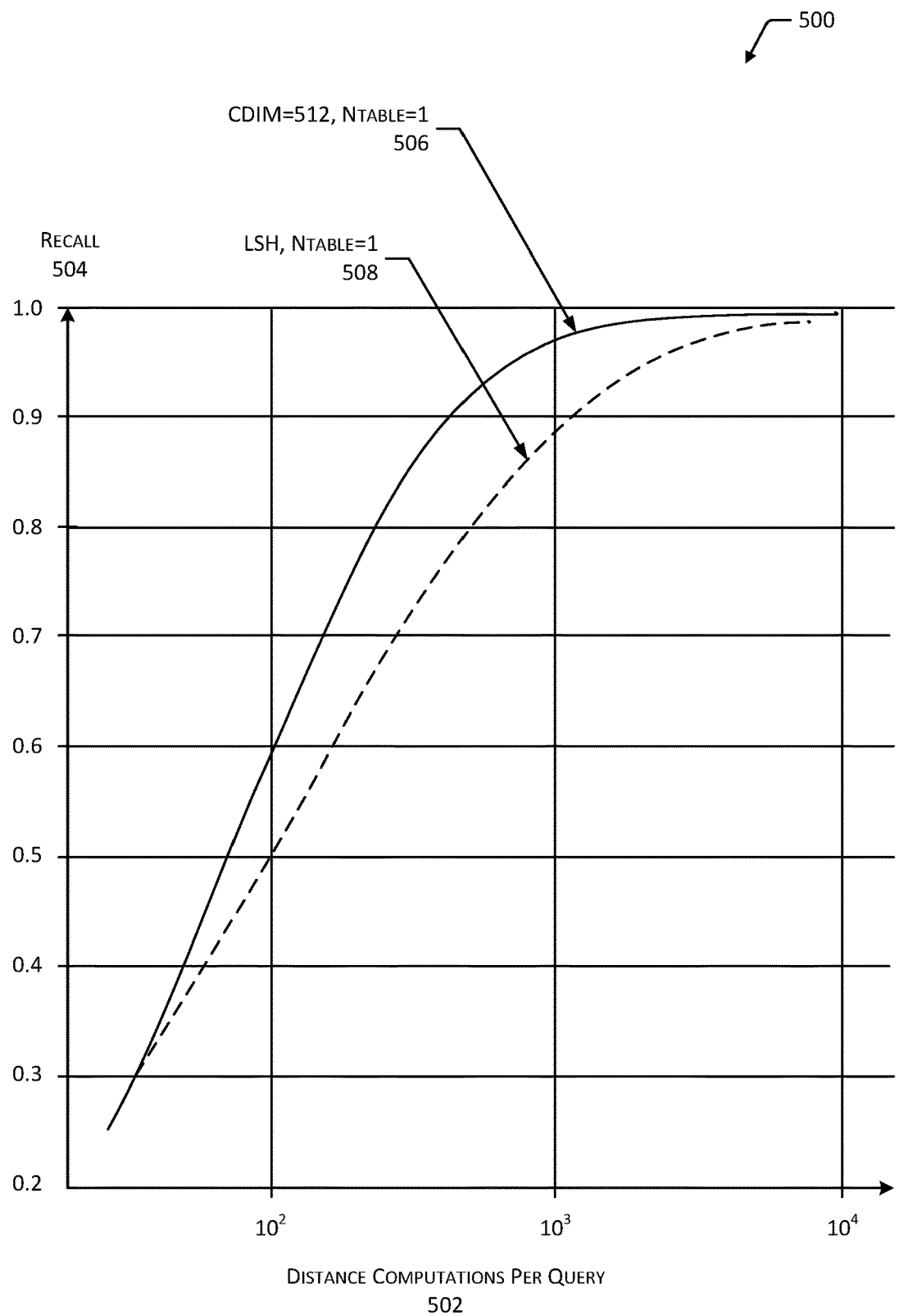
FIG. 5 depicts a graph showing test results indicative of performance improvement of the system compared to locality-sensitive hashing (LSH), according to one implementation.

FIG. 5 depicts a graph 500 showing test results indicative of performance improvement of the system 100 compared to locality-sensitive hashing (LSH), according to one implementation.

A horizontal axis is indicative of a number of distance computations per query 502 on a logarithmic scale. A vertical axis is indicative of recall 504 from 0.2 to 1.0. As discussed above, recall 504 is the fraction of results to a query entry 162 that are less than a threshold distance from the query entry 162 in the vector space of the dataset 102.

A curve 506 depicts test results for one implementation of the system described herein, with a CDIM=512 and using a single dataset index 150, e.g. Ntable=1. For comparison, a curve 508 depicts test results of an implementation of LSH with Ntable=1. At $10^2$ distance computations per query 502 the single table system 100 provides a recall of about 0.6 while the single table LSH only provides a recall of about 0.5. At $10^3$ distance computations per query 502, the single table system 100 provides a recall of about 0.98 while the single table LSH only provides a recall of about 0.88. While not shown in this graph, to achieve recall results similar to those of 506, tests indicate an LSH with Ntable=8 would be required.

As depicted by these test results, the system 100 is able to provide a substantial performance impact while utilizing fewer computational resources. For example, less memory is needed to store the single dataset index 150 of 506 compared to the 8 tables of LSH needed to perform with similar recall.

Figure 6:
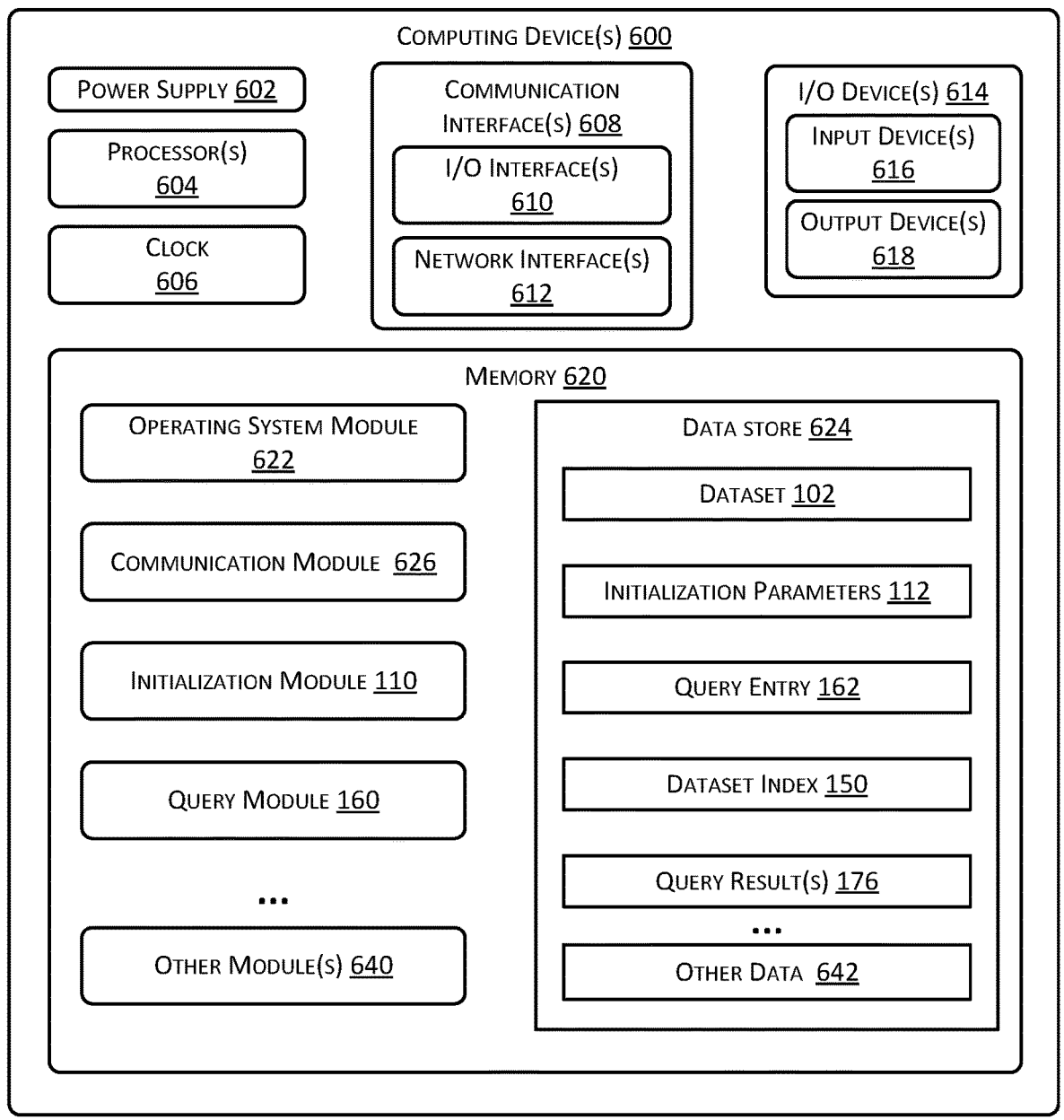
FIG. 6 is a block diagram of a computing device to implement the system, according to some implementations.

FIG. 6 is a block diagram of a computing device 600 to implement the system 100, according to some implementations. The computing device 600 may be implemented as one or more of an "embedded system", "on-demand computing", "software as a service (Saas)", "platform computing", "network-accessible platform", "cloud services", "data centers", and so forth. Services provided by the computing device 600 may be distributed across one or more physical or virtual devices.

One or more power supplies 602 may be configured to provide electrical power suitable for operating the components in the computing device 600. The one or more power supplies 602 may comprise batteries, connections to an electric utility, and so forth. The computing device 600 may include one or more hardware processors 604 (processors) configured to execute one or more stored instructions. For example, the hardware processors 604 may include application specific integrated circuits (ASICs), field-programmable gate arrays (FPGAs), digital signal processors (DSPs), hardware accelerators, graphics processing units (GPUs), and so forth. For example, the processors 604 may include hardware optimized to perform one or more functions of the embedding module 124, the list decoder module 140, and so forth. The processors 604 may comprise one or more cores. One or more clocks 606 may provide information indicative of date, time, ticks, and so forth.

The computing device 600 may include one or more communication interfaces 608 such as input/output (I/O) interfaces 610, network interfaces 612, and so forth. The communication interfaces 608 enable the computing device 600, or components thereof, to communicate with other devices or components. The communication interfaces 608 may include one or more I/O interfaces 610. The I/O interfaces 610 may comprise Inter-Integrated Circuit (I2C), Serial Peripheral Interface bus (SPI), Universal Serial Bus (USB) as promulgated by the USB Implementers Forum, RS-232, Peripheral Component Interconnect (PCI), serial AT attachment (SATA), Fibre Channel (FC), and so forth.

The I/O interface(s) 610 may couple to one or more I/O devices 614. The I/O devices 614 may include input devices 616 such as one or more of a sensor, keyboard, mouse, scanner, and so forth. The I/O devices 614 may also include output devices 618 such as one or more of a display device, printer, audio speakers, and so forth. In some embodiments, the I/O devices 614 may be physically incorporated with the computing device 600 or may be externally placed.

The network interfaces 612 may be configured to provide communications between the computing device 600 and other devices, such as routers, access points, and so forth. The network interfaces 612 may include devices configured to couple to personal area networks (PANs), local area networks (LANs), wireless local area networks (WLANS), wide area networks (WANs), and so forth. For example, the network interfaces 612 may include devices compatible with Ethernet, Wi-Fi, Bluetooth, and so forth.

The computing device 600 may also include one or more buses or other internal communications hardware or software that allow for the transfer of data between the various modules and components of the computing device 600.

As shown in FIG. 6, the computing device 600 includes one or more memories 620. The memory 620 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 620 provides storage of computer-readable instructions, data structures, program modules, and other data for the operation of the computing device 600. A few example functional modules are shown stored in the memory 620, although the same functionality may alternatively be implemented in hardware, firmware, or as a system on a chip (SoC).

The memory 620 may include at least one operating system (OS) module 622. The OS module 622 is configured to manage hardware resource devices such as the I/O interfaces 610, the I/O devices 614, the communication interfaces 608, and provide various services to applications or modules executing on the processors 604. The OS module 622 may implement a variant of the FreeBSD operating system as promulgated by the FreeBSD Project; other UNIX or UNIX-like variants; a variation of the Linux operating system as promulgated by Linus Torvalds; the Windows operating system from Microsoft Corporation of Redmond, Washington, USA; and so forth.

Also stored in the memory 620 may be a data store 624 and one or more of the following modules. For example, these modules may be executed as foreground applications, background tasks, daemons, and so forth. The data store 624 may use a flat file, database, linked list, tree, executable code, script, or other data structure to store information. In some implementations, the data store 624 or a portion of the data store 624 may be distributed across one or more other devices including other computing devices 600, network attached storage devices, and so forth.

The data store 624 may store one or more of the dataset 102, initialization parameters 112, query entry 162, dataset index 150, query result(s) 176, and so forth.

A communication module 626 may be configured to establish communications with other computing devices 600 or other devices. The communications may be authenticated, encrypted, and so forth.

The memory 620 may also store the initialization module 110, and the query module 160.

Other modules 640 may also be present in the memory 620 as well as other data 642 in the data store 624. For example, a web server module may provide a web interface to allow customers to perform searches of the dataset 102 using the query module 160.

While the system 100 is discussed with respect to processing datasets and queries pertaining to items for sale, the system may be used with other types of data. For example, the data set 102 may comprise weather data, medical data, sensor data, image data, and so forth.

The processes discussed herein may be implemented in hardware, software, or a combination thereof. In the context of software, the described operations represent computer-executable instructions stored on one or more non-transitory computer-readable storage media that, when executed by one or more processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, environments, and situations.

Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A system comprising:
   a memory, storing first computer-executable instructions; and
   a hardware processor to execute the first computer-executable instructions to:
      determine a dataset comprising a first entry and a second entry;
      determine a code mask that is associated with an embedding space;
      determine, within the embedding space:
         a first binary embedding of the first entry; and
         a second binary embedding of the second entry;
      determine, using a polar code:
         a first codeword that is associated with a first cluster in the embedding space; and
         a second codeword that is associated with a second cluster in the embedding space;
      determine, using the first binary embedding as an input to a list decoder, the first codeword;
      determine a first cluster identifier based on the first codeword;
      determine, using the second binary embedding as an input to the list decoder, the second codeword;
      determine a second cluster identifier based on the second codeword; and
      determine a first index indicative of an association between:
         the first cluster identifier and the first entry; and
         the second cluster identifier and the second entry.

2. The system of claim 1, the hardware processor to further execute the first computer-executable instructions to:
   determine a query entry;
   determine, within the embedding space, a third binary embedding of the query entry;
   determine, using the third binary embedding as an input to the list decoder of the polar code, a third codeword and a fourth codeword;
   determine, based on the code mask and the third codeword, the first cluster identifier;
   determine, based on the code mask and the fourth codeword, the second cluster identifier; and
   determine the first entry and the second entry are associated with the query entry.

3. A computer-implemented method comprising:
   determining a dataset comprising a first entry;
   determining a first embedding of the first entry in an embedding space;
   determining, using an error correction code (ECC), a first codeword that is associated with a first cluster in the embedding space;
   determining the first codeword is associated with the first embedding; and
   determining a first index that is indicative of an association between the first entry and one or more of the first codeword or a first cluster identifier indicative of the first cluster.

4. The method of claim 3, wherein a first distance in the embedding space between the first embedding and a second embedding of the first codeword is less than a second distance in the embedding space between the first embedding and a third embedding of a second codeword.

5. The method of claim 3, further comprising:
determining a mask that is associated with the embedding space;
wherein the ECC comprises a polar code and the mask comprises a polar code mask.

6. The method of claim 3, wherein the first embedding is determined using a hyperplane locality-sensitive hash (LSH).

7. The method of claim 3, wherein the first codeword is associated with a plurality of embeddings associated with respective dataset entries.

8. The method of claim 3, wherein the first codeword has a first bit length; and the method further comprising:
determining a mask that is associated with the embedding space; and
determining the first cluster identifier based on the mask and the first codeword, wherein the first cluster identifier has a second bit length that is less than the first bit length.

9. The method of claim 3, wherein the first index is further indicative of a second entry that is also associated with the first codeword; and the method further comprising:
determining a mask that is associated with the embedding space;
determining a third entry;
determining a second embedding of the third entry within the embedding space;
determining, using a list decoder that the second embedding is associated with, a second codeword;
determining, using the mask and the second codeword, the first cluster identifier; and
determining that the third entry is associated with the first entry and the second entry.

10. The method of claim 9, the determining the second embedding comprising:
determining a third embedding of the third entry; and one or more of:
processing the third embedding using an exclusive or (XOR) mask to determine the second embedding, or
processing the third embedding using a first value to determine the second embedding.

11. The method of claim 9, further comprising:
determining a first value indicative of a number of codewords to return; and
wherein the list decoder uses the first value.

12. The method of claim 9, the determining that the third entry is associated with the first entry and the second entry comprising:
determining, in a first vector space associated with the dataset, a first distance between the third entry and the first entry;
determining that the first distance is less than a first threshold distance;
determining, in the first vector space, a second distance between the third entry and the second entry; and
determining that the second distance is less than the first threshold distance.

13. A system comprising:
a memory, storing first computer-executable instructions; and
a hardware processor to execute the first computer-executable instructions to:
determine a dataset comprising a first entry;
determine a first embedding of the first entry in an embedding space;
determine a first codeword that is associated with a first cluster in the embedding space;
determine the first codeword is associated with the first embedding; and
determine a first index that is indicative of an association between the first codeword and the first entry, wherein the association between the first codeword and the first entry comprises a first cluster identifier indicative of the first cluster.

14. The system of claim 13, wherein a first distance in the embedding space between the first embedding and a second embedding associated with the first codeword is less than a second distance in the embedding space between the first embedding and a third embedding of a second codeword.

15. The system of claim 13, wherein the instructions to determine the first codeword use a polar code algorithm.

16. The system of claim 13, wherein the first codeword is associated with a plurality of embeddings associated with respective dataset entries.

17. The system of claim 13, the hardware processor to further execute the first computer-executable instructions to:
determine a query entry;
determine, within the embedding space, a second embedding of the query entry;
determine, based on the second embedding, a set of codewords comprising at least a second codeword;
determine, based on the set of codewords, a portion of the dataset; and
determine a set of query results based on a search of the portion of the dataset.

18. The system of claim 17, wherein the instructions to determine the set of codewords uses a polar code list decoder algorithm.

19. The system of claim 13, the hardware processor to further execute the first computer-executable instructions to:
determine a query entry;
determine, within the embedding space, a second embedding of the query entry;
process the second embedding using one or more functions to determine a third embedding, wherein the one or more functions comprise:
an exclusive or (XOR) operation using an XOR mask, or
an operation using a first value;
determine, based on the third embedding, a set of codewords comprising at least a second codeword;
determine, based on the set of codewords, a portion of the dataset; and
determine a set of query results based on a search of the portion of the dataset.

20. The system of claim 13, the hardware processor to further execute the first computer-executable instructions to:
determine a query entry;
determine a query embedding of the query entry within the embedding space;
determine, using a list decoder, that the query embedding is associated with a query codeword;
determine, based on the query codeword, the first cluster identifier; and
determine a set of query results based on a search of one or more entries associated with the first cluster identifier.

* * * * *